(12) United States Patent
Goldstein et al.

(10) Patent No.: US 6,621,321 B2
(45) Date of Patent: Sep. 16, 2003

(54) CIRCUIT FOR CONDITIONING OUTPUT WAVEFORM

(75) Inventors: Stephan Goldstein, Reading, MA (US); Bruce Hecht, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 157 days.

(21) Appl. No.: 09/885,806

(22) Filed: Jun. 20, 2001

(65) Prior Publication Data

US 2002/0196013 A1 Dec. 26, 2002

(51) Int. Cl.$^7$ ................................................ H03K 5/08
(52) U.S. Cl. ........................................ 327/321; 327/383
(58) Field of Search ................................ 327/309, 318, 327/319, 321, 374, 376, 379, 380, 381, 383, 390

(56) References Cited

U.S. PATENT DOCUMENTS

| | | | | |
|---|---|---|---|---|
| 5,010,297 A | * | 4/1991 | Babcock | 324/763 |
| 5,434,446 A | | 7/1995 | Hilton et al. | 257/503 |
| 5,808,504 A | * | 9/1998 | Chikai et al. | 327/434 |
| 5,949,270 A | * | 9/1999 | Saito | 327/390 |
| 6,072,353 A | * | 6/2000 | Matsuzawa | 327/390 |
| 6,507,231 B1 | * | 1/2003 | Hecht et al. | 327/321 |

\* cited by examiner

*Primary Examiner*—Jeffrey Zweizig
(74) *Attorney, Agent, or Firm*—Bromberg & Sunstein LLP (57) ABSTRACT

An apparatus for conditioning an output waveform delivered from a testing device produces an output voltage that is the sum of a control voltage and an input voltage. To that end, the apparatus includes an input for receiving the input voltage, and an output capable of producing the output voltage. The output is coupled with the testing device. The apparatus further includes a voltage element coupled between the input and the output, and a switching element to alternatively charge and discharge the voltage element. The switching element controls the voltage element to change the control voltage between a first voltage and a second voltage. Consequently, the output voltage is the sum of the control voltage and the input voltage.

20 Claims, 6 Drawing Sheets

CIRCUIT FOR CONDITIONING OUTPUT WAVEFORM

FIELD OF THE INVENTION

The invention relates generally to data signal generation and, more particularly, the invention relates to a circuit for conditioning data signals.

BACKGROUND OF THE INVENTION

Testing equipment has been used for many years to evaluate the performance of integrated circuits prior to their shipment to customers. Among other things, testing equipment typically includes a large number of "pin cards" that each have circuitry for communicating with one corresponding pin of the integrated circuit being tested (referred to in the art as the "device under test," or "DUT"). Each pin card may include a so-called "pin driver" for transmitting a test signal to its corresponding pin on the DUT. To that end, the pin driver typically is connected to its corresponding pin via a relatively short transmission line. For additional background information relating to testing equipment and pin drivers, see U.S. Pat. No. 5,010,297, the disclosure of which is incorporated herein, in its entirety, by reference.

The pin driver may transmit many different types of test signals to the DUT. One such test signal may be a pulse with a very short rise time. As known by those skilled in the art, pulses with short rise times have associated high frequency components that are filtered out when transmitted through a transmission line. For example, it is very likely that the high frequency components of one such pulse would be filtered out when transmitted through a transmission line typically used with the above discussed testing equipment. Consequently, if transmitted through the noted transmission line, such pulse undesirably would be received by the DUT with a much longer rise time. Moreover, the rise time may be substantially nonlinear. In other words, the test signal received by the DUT often is a significantly distorted version of that transmitted. To ensure the accuracy of the test, however, a precise pulse similar to that transmitted by the pin driver should be received by the DUT.

SUMMARY OF THE INVENTION

In accordance with one aspect of the invention, an apparatus for conditioning an output waveform delivered from a testing device produces an output voltage that is the sum of a control voltage and an input voltage. To that end, the apparatus includes an input for receiving the input voltage, and an output capable of producing the output voltage. The output is coupled with the testing device. The apparatus further includes a voltage element coupled between the input and the output, and a switching element to alternatively charge and discharge the voltage element. The switching element controls the voltage element to change the control voltage between a first voltage and a second voltage. Consequently, the output voltage is the sum of the control voltage and the input voltage.

In illustrative embodiments, the output waveform is clamped by the sum of the control voltage and the input voltage. The voltage element may include a resistance and a capacitance. For example, the voltage element may include a resistor in parallel with a capacitor. In such case, the control voltage has an associated decay rate that is a function of the resistance and capacitance of the voltage element.

In other embodiments, the control voltage is produced by a current transmitting through a resistance, and the current is controllable to control the amplitude of the control voltage. The switching element may include a first switch along a first current path, and a second switch along a second current path. The first current path is in parallel with the second current path. The control voltage may be either one of a positive or negative voltage.

In accordance with another aspect of the invention, a circuit for controlling the output voltage produced by a Class-AB driver includes an input for receiving an input DC voltage, and an output coupled with the Class-AB driver. The output has an associated output voltage. In addition, the circuit also has a voltage element coupled between the input and the output, and a switching element to alternatively charge and discharge the voltage element. The voltage element is controlled by the switching element to have a control voltage between a first voltage and a second voltage. The output voltage is the sum of the control voltage and the input voltage.

In some embodiments, the output waveform is clamped by the output voltage of the circuit. Moreover, the voltage element may include a resistance and a capacitance. In such case, the control voltage has an associated decay rate that is a function of the resistance and capacitance of the voltage element. The control voltage may be one of a positive voltage and a negative voltage.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a testing device (referred to below as a "driver") conditions a test waveform before transmitting it across a line to a device being tested. For example, the test waveform may be a pulse having very short rise and fall times. Before transmission, the test waveform is conditioned to compensate for high frequency signal losses caused by the line, thus causing the device being tested to receive a test signal with minimal unintended distortion. Details of illustrative embodiments are discussed below.

Figure 1:
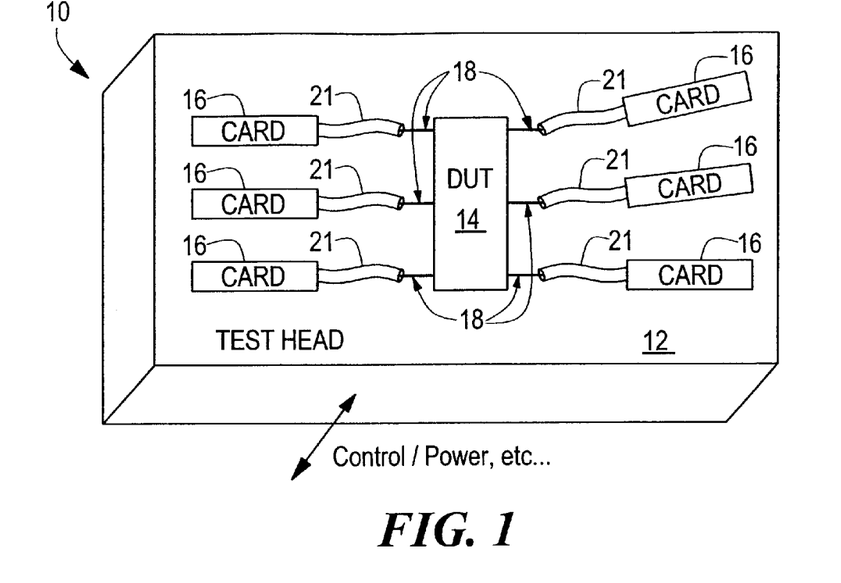
FIG. 1 schematically shows a test head that may be used with illustrative embodiments of the invention.

FIG. 1 schematically shows a portion of an automatic testing device 10 that may be configured in accordance with illustrative embodiments of the invention. In particular, the testing device 10 includes a test head 12 with a socket (not shown) for receiving a device to be tested. The device to be tested may be any device commonly tested by such testing equipment, such as an integrated circuit. By way of example, the integrated circuit may be a VLSI chip, or a memory chip. Those skilled in the art commonly refer to the device being tested as the "device under test," or the "DUT" (identified herein by reference number 14).

The test head 12 includes electronics for testing each pin 18 on the DUT 14. To that end, the test head 12 includes a plurality of testing cards 16 that each tests one pin 18 on the DUT 14. The DUT 14 shown in FIG. 1, for example, has six pins 18 and thus, the test head 12 includes six test cards 16 to test all the pins 18 on the DUT 14. Since test heads commonly have more than six test cards 16, it should be noted that six test cards 16 are shown as exemplary only and not as a limitation of various embodiments of the invention. In a similar manner, the DUT 14 can more than six pins 18. Accordingly, discussion of six pins 18 also is by example only and not intended to be a limitation on various embodiments of the invention.

Each test card 16 includes a driver circuit ("driver 20," shown in FIG. 2) for transmitting a test signal to the pin 18 that it is testing, and a comparator apparatus ("comparator," shown in FIG. 2) for analyzing any data signal received from the pin 18. Of course, if the pin 18 is for receiving an input signal only, then only the driver 20 is used. In a similar manner, if the pin 18 is for transmitting an output signal only, then only the comparator apparatus is used. Of course, if the pin 18 is for both input and output, then both the driver 20 and comparator apparatus may be used. Each test card 16 also includes an input for receiving control data, power, and other related information from another part (not shown) of the testing equipment.

Figure 2:
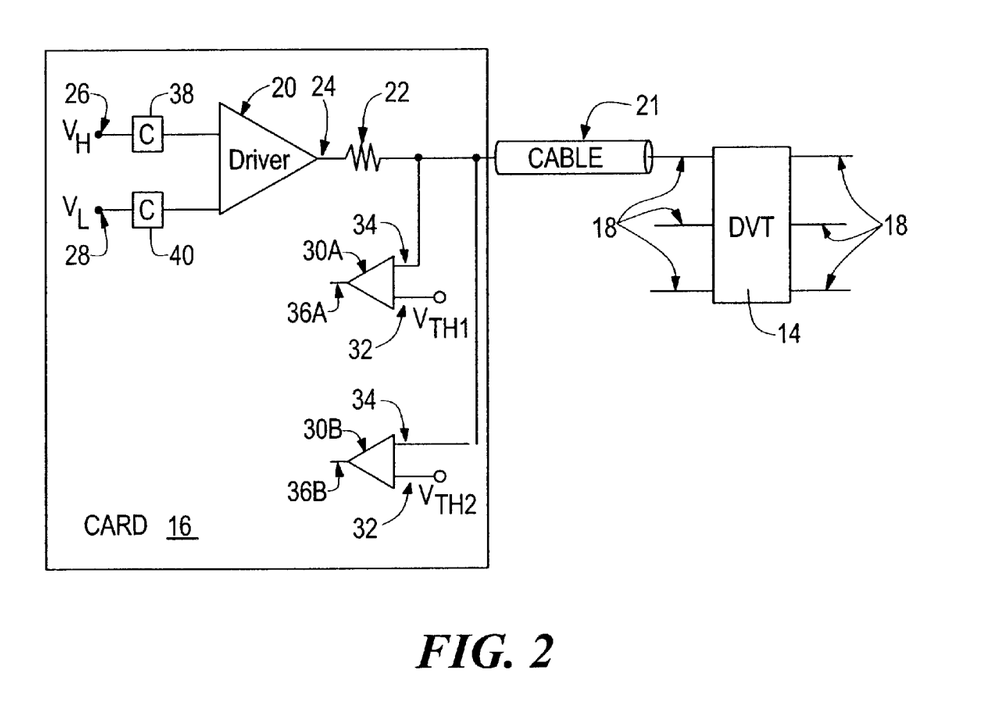
FIG. 2 schematically shows a testing card configured in accordance with illustrative embodiments of the invention for use in the test head shown in FIG. 1.

FIG. 2 schematically shows details of an exemplary testing card 16. In particular, the testing card 16 includes a driver 20 (noted above) that is connected to one pin 18 on the DUT 14 via a transmission cable 21. In illustrative embodiments, the transmission cable 21 has a characteristic impedance (e.g., about 50 ohms), and is terminated on its driver side by a termination resistor 22. It is preferable for the combined resistance of the termination resistor 22 and the driver output to match the impedance of the transmission cable 21 (e.g., fifty ohms for a fifty ohm transmission cable 21). The driver 20 also includes an output ("driver output 24") for transmitting a testing signal to the DUT 14 (via the cable 21), and a pair of DC voltage inputs 26 and 28 for clamping the maximum and minimum amplitude of the output testing signal. The DC voltage inputs 26 and 28 therefore include a high voltage input (referred to herein as "Vhigh input 26"), and a low voltage input (referred to as "Vlow input 28"). Exemplary voltages applied to the Vhigh and Vlow inputs 26 and 28 may be about 5 volts and 1 volt, respectively.

In addition to the above noted elements, the test card 16 also includes the prior noted comparator apparatus, which has a pair of comparators 30A and 30B. Each comparator 30A and 30B includes a threshold input 32 for receiving a DC threshold voltage, a return input 34 for receiving a data signal (from the DUT 14) to be compared against its respective threshold voltage, and a comparator output 36 for delivering output data reporting the results of the comparison. As known by those skilled in the art, each comparator 30A and 30B produces output data specifying the voltage of the received data signal relative to its threshold voltage. In various embodiments, the threshold voltage on one comparator 30A or 30B is set to be higher than that of the other comparator 30A or 30B. Accordingly, the higher threshold voltage is known as the "high threshold voltage," while the lower threshold voltage is known as the "low threshold voltage." Those skilled in the art should understand, however, that many different types of comparator devices can be used. Accordingly, the disclosed comparator apparatus is exemplary only and not intended to limit various embodiments of the invention.

In accordance with illustrative embodiments of the invention, a high voltage conditioning circuit 38 is coupled with the Vhigh input 26, and a low voltage conditioning circuit 40 is coupled with the Vlow input 28. Accordingly, the Vhigh voltage is buffered from the driver 20 by the high voltage conditioning circuit 38, and the Vlow voltage is buffered from the driver 20 by the Vlow conditioning circuit. Each conditioning circuit is configured to modify its respective input DC voltage signal, consequently controllably modifying the output signal transmitted to the DUT 14. Specifically, the high voltage conditioning circuit 38 is configured to increase the Vhigh voltage, received by the driver 20, by a programmed amount for a prespecified time period. Correspondingly, the Vlow conditioning circuit is configured to decrease the Vlow voltage, received by the driver 20, by a programmed amount for a prespecified time period.

Modifying the Vhigh voltages and Vlow voltages causes the driver output signal to have a higher amplitude than that intended to be received by the DUT 14. This conditioning is preferable, however, because the transmission cable 21 between the driver 20 and the DUT 14 filters (i.e., distorts) the output signal to a more desirable form when received by the DUT 14. In illustrative embodiments, this conditioning produces a waveform that appears as the desired waveform after passing through the transmission cable 21.

Figure 3:
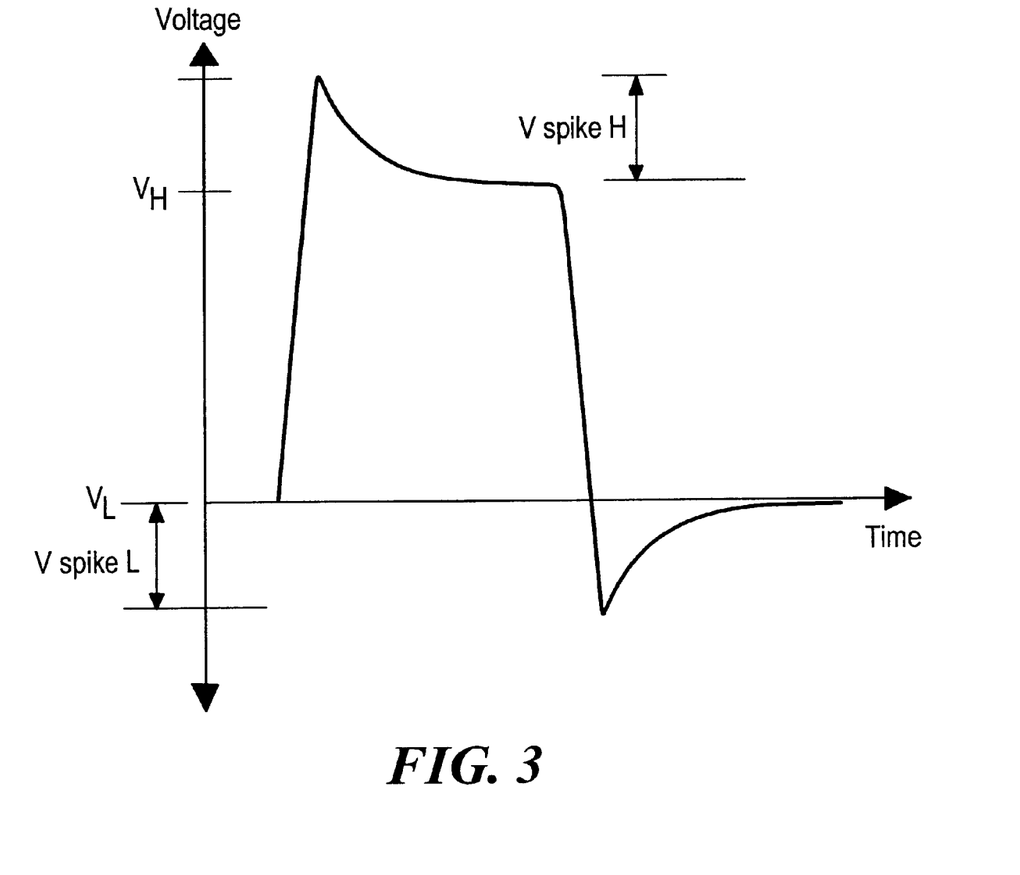
FIG. 3 graphically shows an exemplary conditioned output waveform delivered by the testing card shown in FIG. 2.

FIG. 3 graphically shows an exemplary conditioned pulse that is transmitted to the DUT 14 as an output signal. The output signal voltage rises to a maximum amplitude of VspikeH volts greater than Vhigh. Once it reaches the maximum amplitude, the output voltage decays in a controlled manner to the Vhigh voltage for a predetermined amount of time. After the predetermined amount of time, the amplitude of the signal drops rapidly to a minimum voltage of Vlow–VspikeL. Once it reaches the minimum amplitude, the output voltage increases (i.e., decays) in a controlled manner to the Vlow voltage. As noted above, transmitting this conditioned pulse should cause the DUT 14 to receive a pulse having a desirable rise time (among other signal qualities) that can effectively be used for testing purposes. Details of the conditioning circuits and their operation are discussed below with reference to FIGS. 5A and 5B.

Figure 4:
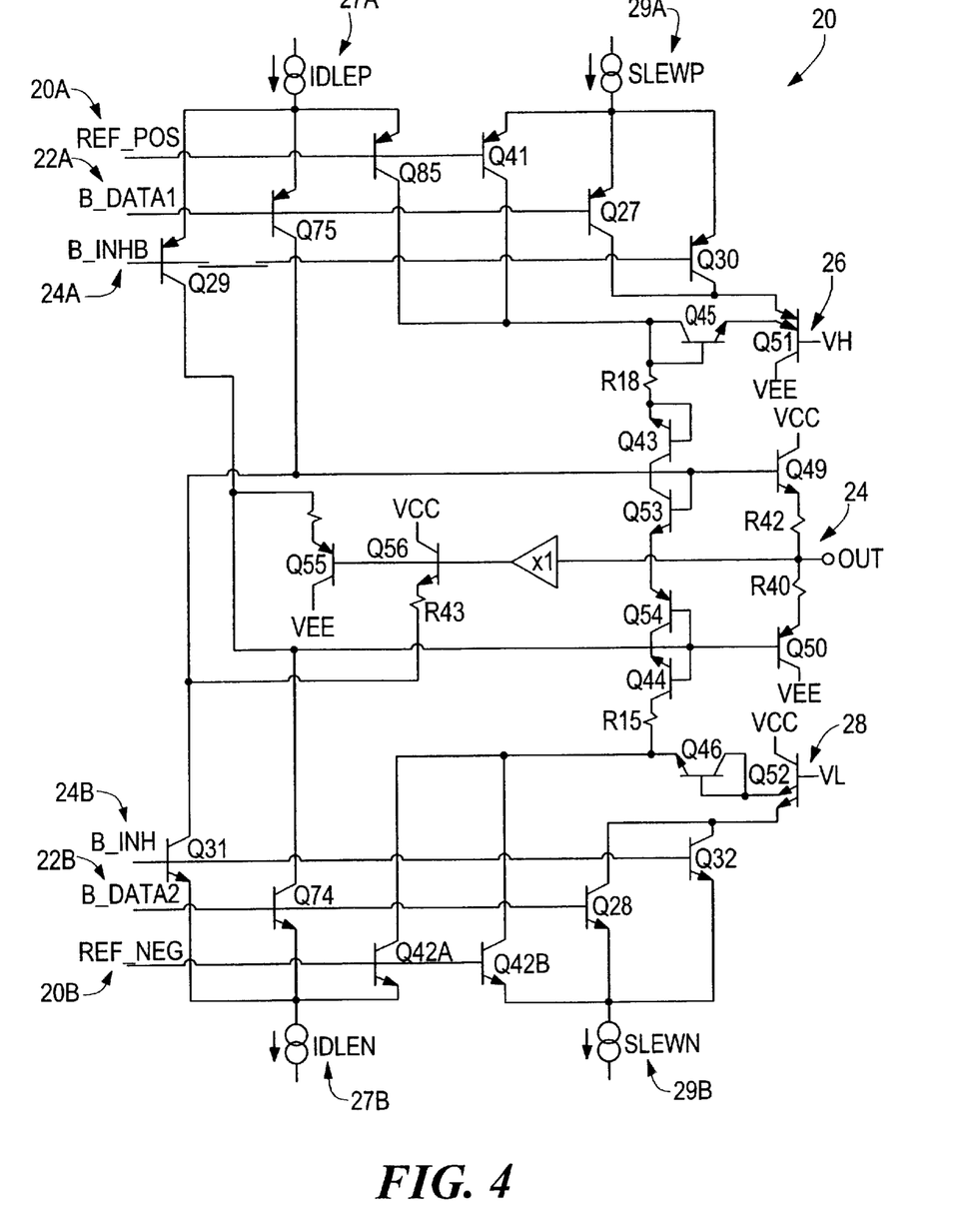
FIG. 4 schematically shows an exemplary driver that may be used in the testing card shown in FIG. 2.

FIG. 4 schematically shows an exemplary circuit configuration that can be used for the driver 20. The driver 20 includes a positive switching array of transistors (Q29, Q75, Q85, Q41, Q27, and Q30) for switching the flow of two positive current sources, a negative switching array of transistors (Q31, Q74, Q42A, Q42B, Q28, and Q32) for switching the flow of two negative current sources, a plurality of bridge transistors (Q45, Q43, Q44, and Q46) for directing current through the driver 20, a pair of power transistors (Q49 and Q50) for delivering power to the driver output 24, and a pair of diodes (Q53 and Q54) for keeping the power transistors Q49 and Q50 in an on state. In illustrative embodiments, the driver 20 is a Class-AB driver, which requires at least one power transistor to be on at all times while the driver 20 is operating. In addition, the driver 20 also includes a Vhigh transistor Q51 coupled with the Vhigh input 26, and a Vlow transistor Q52 coupled with the Vlow input 28. The driver 20 includes other elements, such as transistors Q55 and Q56, a unity gain buffer, and various resistors.

The switching transistors are controlled by a plurality of digital inputs. The digital inputs include three inputs for controlling the positive switching array, and three inputs for controlling the negative switching array. The three inputs for controlling the positive switching array include a positive reference input 20A for maintaining a constant applied input voltage, a positive data input 22A for switching between Vhigh and Vlow voltage modes (discussed below), and a positive inhibit input 24A for switching to an inhibit mode (discussed below). In addition, the three inputs for controlling the negative switching array include a negative reference input 20B for maintaining another constant applied input voltage, a negative data input 22B for switching between Vhigh and Vlow voltage modes (noted above and discussed below), and a negative inhibit input 24B for switching to the noted inhibit mode.

The current sources include a positive idle current source 27A for ensuring that specified transistors remain "on," and a positive slew current source 29A for providing the appropriate rising output voltage as desired at the driver output 24. A corresponding negative idle current source 27B and negative slew current source 29B also are included for similar functions.

The operation of the driver 20 in FIG. 4 now will be discussed. It should be noted that this description of FIG. 4 is made without the conditioning circuits being connected to the Vhigh input 26 and the Vlow input 28. Consequently, the maximum and minimum driver output voltages at the driver output 24 are Vhigh and Vlow, respectively. The process of causing the driver 20 to produce maximum and minimum voltages shown in FIG. 3, however, are discussed below with reference to FIGS. 5A and 5B.

When in operation, an effective capacitance at the node having transistors Q43, Q53, Q54, Q44 and the bases of transistors Q49 and Q50 is charged and discharged, thus causing the output signal to change between Vhigh and Vlow. In particular, when the driver output voltage is transitioning from Vlow to Vhigh, the positive data input 22A has a voltage applied to it that is higher than 20 that applied to the reference input 20A, thus turning on transistors Q85 and Q41. In a corresponding manner, the negative data input 22B also has a voltage applied to it that is higher than that applied to the negative reference input 20B, thus turning on transistors Q74 and Q28. All other switching transistors are off.

As a consequence of the noted switching transistors being on, the positive idle current and negative idle current are connected, thus passing current through the path formed by transistors Q85, Q43, Q53, Q54, and Q74. In addition, the positive slew current passes through the path formed by transistors Q41, Q43, and Q53. At the collector of Q53, which also is the base of the power transistor Q49, which connects to the driver output 24, the above noted effective capacitance charges to a maximum voltage of Vhigh plus one V-base-emitter voltage, thus causing the driver output 24 to rise to a voltage of Vhigh.

Operation of the driver 20 as its output voltage transitions from Vhigh to Vlow now will be discussed. In general, the output voltage is reduced by discharging the above noted effective capacitance. In particular, when the driver output voltage is transitioning from Vhigh to Vlow, the positive data input 22A has an applied voltage that is lower than that of the positive reference input 20A, thus turning on transistors Q75 and Q27. In a corresponding manner, the negative data input 22B has an applied voltage that is lower than that of the negative reference input 20B, thus turning on transistors Q42A and Q42B. All other switching transistors are off.

As a result of the noted switching transistors being on, the positive idle current and negative idle current are connected, thus passing current through the path formed by transistors Q75, Q53, Q54, and Q44, and Q42A. In addition, the positive slew current passes through the path formed by transistors Q27 and Q51, and is transmitted out via VEE of Q51. At the collector of Q53 (which also is the base of output device Q49, which is connected to the driver output 24), the above noted effective capacitance discharges from its maximum voltage of Vhigh plus one V-base-emitter voltage, to its minimum voltage of Vlow plus one V-base-emitter voltage, thus causing the driver output 24 to discharge to Vlow. Accordingly, the negative slew current, which is drawn from the discharging capacitance, passes through transistors Q54, Q44, and Q42B. It should be noted that the idle current and negative slew current both have a common sub-path through Q54 and Q44. Due to the discharging capacitance, the output voltage drops toward the minimum voltage Vlow.

There are instances when the idle and slew currents within the driver 20 are switched to cause the driver output 24 to have a very high impedance. Stated another way, when in this mode, the driver output 24 appears to be an open circuit to a coupled load. To this end, the positive and negative inhibit inputs 24A and 24B are set so that transistors Q29, Q30, Q31, and Q32 are on. All other switching transistors are off. This directs all current away from the bridge transistors (Q42, Q53, Q54, Q44 and Q46) and the power transistors (Q49 and Q50). To that end, the positive idle current passes through Q29 and Q55, and the negative idle current passes through transistors Q56 and Q31. In a similar manner, the positive slew current passes through transistors Q27, Q30 and Q51, while the negative slew current passes through transistors Q52 and Q32.

Figure 5A:
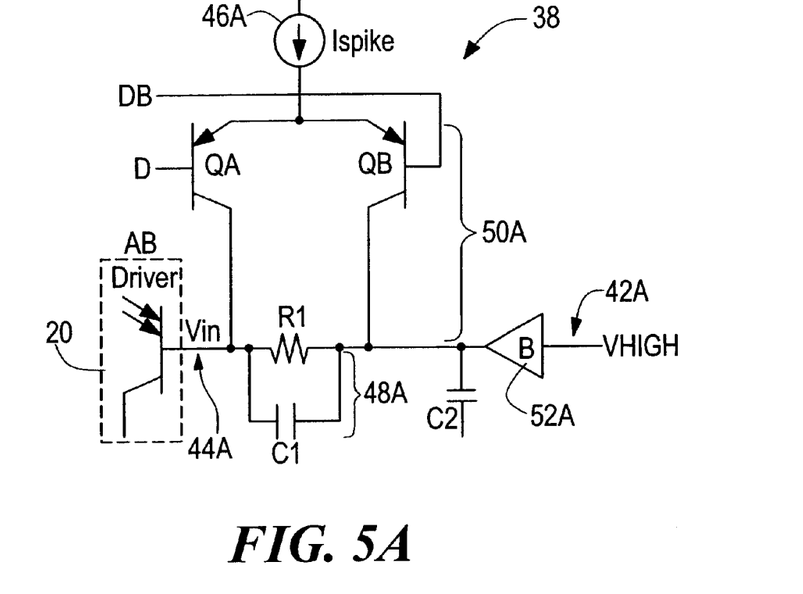
FIG. 5A schematically shows a high input voltage conditioning circuit configured in accordance with illustrative embodiments for use with the driver shown in FIG. 4.
Figure 5B:
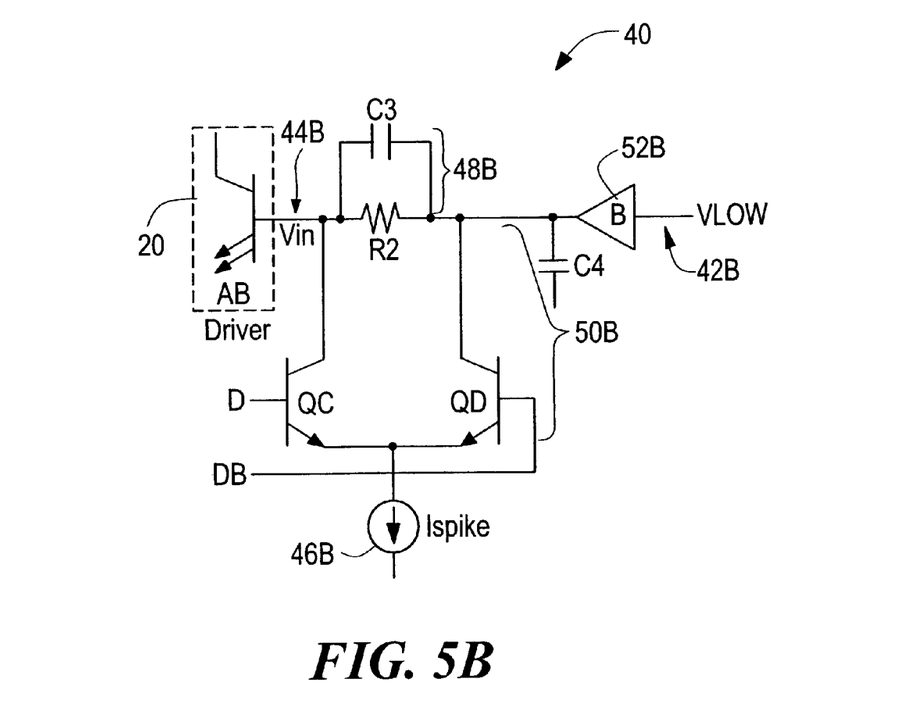
FIG. 5B schematically shows a low input voltage conditioning circuit configured in accordance with illustrative embodiments for use with the driver shown in FIG. 4.

As previously noted, illustrative embodiments of the invention condition the output voltage of the driver 20 by coupling the conditioning circuits with the Vhigh and Vlow inputs 26 and 28 of the driver 20. FIGS. 5A and 5B schematically show the high voltage conditioning circuit 38 and low voltage conditioning circuit 40, respectively. Specifically, as shown in FIG. 5A, the high voltage conditioning circuit 38 includes an input 42A to receive the Vhigh voltage (i.e., the voltage originally intended for the Vhigh input 26 on the driver 20 of FIG. 4), an output 44A to couple with the Vhigh input 26 of the driver 20 (i.e., to couple with the base of transistor Q51), and conditioning circuitry for conditioning the received Vhigh voltage.

The conditioning circuitry includes a programmable current source 46A (referred to herein as IspikeH current source), a voltage element 48A to produce a controlled voltage (referred to herein as "VspikeH") based upon the IspikeH current, a switching element 50A to control the direction of current flow through the voltage element 48A, and a low impedance unity gain buffer 52A. A capacitor C2 may be coupled with the buffer to reduce the impedance of the buffer 52A. In illustrative embodiments, the voltage element 48A includes a resistor R1 and a parallel capacitor C1. Also in illustrative embodiments, the switching element 50A includes two PNP transistors (Qa and Qb) with coupled emitters. Voltages applied to the bases of the PNP transistors Qa and Qb control the switching of such circuit 38.

In operation, the high voltage conditioning circuit 38 produces a voltage across its output 44A equaling the sum of Vhigh and VspikeH. This produced voltage is applied to the Vhigh input 26 of the driver 20, thus conditioning the driver output voltage to its form shown in FIG. 3. To that end, the conditioning circuit is in an "off" state when its output 44A has a voltage of Vhigh, and it is in an "on" state when its output 44A has a voltage equal to the sum of Vhigh and VspikeH. When in the on state, transistor Qa is on, and transistor Qb is off. Consequently, the IspikeH current passes through transistor Qa, through the resistor R1, and through the buffer. This produces a voltage across capacitor C1 (i.e., the prior noted VspikeH), thus producing the conditioned output (i.e., Vhigh+VspikeH). When in the off state, transistor Qa is off, while transistor Qb is on. As a result, the IspikeH current drains through the buffer. The current in the capacitor C1 is dissipated as heat as it flows through the resistor R1. The voltage in the capacitor C1 thus decays to a zero voltage to produce a voltage of Vhigh across the output 44A.

To compensate for potential leakage current from the transistor Q51, a second switching element and second current source may be connected to the voltage element 48A. Although not shown, the second switching element and second current source may be configured in a manner that is similar to the switching element 50A and current source 46A. In particular, the second switching element may be two PNP transistors having connected emitters that are connected to the second current source. In addition, each PNP transistor in the second switching element has its base connected to one of the transistors in the switching element 50A, and its collector connected to the collector of the other one of the transistors in the switching element 50A. For example, one of the transistors in the second switching element has its base connected to the base of transistor Qa, and its collector connected to the collector of transistor Qb. In a similar manner, the other transistor of the second switching element has its base connected to the base of transistor Qb, and its collector connected to the collector of transistor Qa.

Accordingly, when transistor Qa is on, the transistor in the second switching element having its base connected to the base of transistor Qa is on, thus causing current to flow from the second current source in a manner that compensates for the aforementioned leakage current. In a corresponding manner, when Qb is on, the transistor in the second switching element having its base connected to the base of transistor Qb is on, thus causing current to flow from the second current source in a manner that compensates for the aforementioned leakage current.

FIG. 5B shows the low voltage conditioning circuit 40, which includes an input 42B to receive the low voltage (i.e., the voltage originally intended for the Vlow input 28 on the driver 20 of FIG. 4), an output 44B to couple with the Vlow input 28 of the driver 20 (i.e., to couple with the base of transistor Q52), and conditioning circuitry for conditioning the received Vhigh voltage. The conditioning circuitry includes a programmable current source 46B (similarly referred to herein as "IspikeL current source 46B"), a voltage element 48B to produce a controlled voltage (referred to herein as "VspikeL") based upon the IspikeL current, a switching element 50B to control the direction of current flow through the voltage element, and a low impedance unity gain buffer 52B. A capacitor C4 may be coupled with the buffer 52B to reduce the impedance of the buffer 52B.

In illustrative embodiments, the voltage element 48B includes a resistor R2 and a parallel capacitor C3. Also in illustrative embodiments, the switching element 50B includes two NPN transistors (Qc and Qd) with coupled emitters. Voltages applied the bases of the NPN transistors Qa and Qb controls the switching of the circuit 40.

In operation, the low voltage conditioning circuit 40 produces a voltage across its output 44B having a negative amplitude equaling the sum of Vlow and VspikeL. This produced voltage is applied to the Vlow input 28 of the driver 20, thus conditioning the driver output voltage to its form shown in FIG. 3. To that end, this conditioning circuit 40 is in an "off" state when its output 44B has a voltage of Vlow, and it is in an "on" state when its output 44B has an voltage with a negative amplitude equal to the sum of Vlow and VspikeL. When in the on state, transistor Qc is on, and transistor Qd is off. Consequently, the IspikeL current passes through transistor Qc, which draws current through the resistor R2 and the buffer. This causes a voltage across capacitor C3 (i.e., the above noted VspikeL voltage), thus producing the conditioned output (i.e., Vout−VspikeL). When in the off state, transistor Qc is off, while transistor Qd is on. As a result, the current drawn from the buffer 52B drains through the IspikeL current source, and the current in the capacitor discharges across the resistor R2 (i.e., dissipating as heat). The voltage in the capacitor C1 thus decays to a zero voltage to produce a voltage of Vlow across the output.

In a manner similar to the circuit shown in FIG. 5A, additional circuitry also may be included to compensate for potential leakage current from the transistor Q52. To that end, an additional switching element and additional current source may be connected to the voltage element 48B. Although not shown, the additional switching element and additional current source may be configured in a manner that is similar to the switching element 50B and current source 46B. In particular, the additional switching element may be two NPN transistors having connected emitters that are connected to the additional current source. In addition, each NPN transistor in the additional switching element has its base connected to one of the transistors in the switching element 50B, and its collector connected to the collector of the other one of the transistors in the switching element 50B. For example, one of the transistors in the additional switching element has its base connected to the base of transistor Qc, and its collector connected to the collector of transistor Qd. In a similar manner, the other transistor of the additional switching element has its base connected to the base of transistor Qd, and its collector connected to the collector of transistor Qc.

Accordingly, when transistor Qc is on, the transistor in the additional switching element having its base connected to the base of transistor Qc is on, thus causing current to flow from the additional current source in a manner that compensates for the aforementioned leakage current. In a corresponding manner, when Qd is on, the transistor in the additional switching element having its base connected to the base of transistor Qd is on, thus causing current to flow from the additional current source in a manner that compensates for the aforementioned leakage current.

In illustrative embodiments, the amplitudes of the VspikeH and Vspike L are equal in both conditioning circuits 38 and 40. To that end, the resistance of resistors R1 and R2 illustratively are identical, and the respective amplitudes of the Ispike current in both circuits are identical. In alternative embodiments, the resistors R1 and R2 are different, and the Ispike currents are coordinated to produce respective VspikeH and VspikeL voltages of equal amplitude. In still other embodiments, the VspikeH and VspikeL voltages can be different for both circuits.

Figure 6:
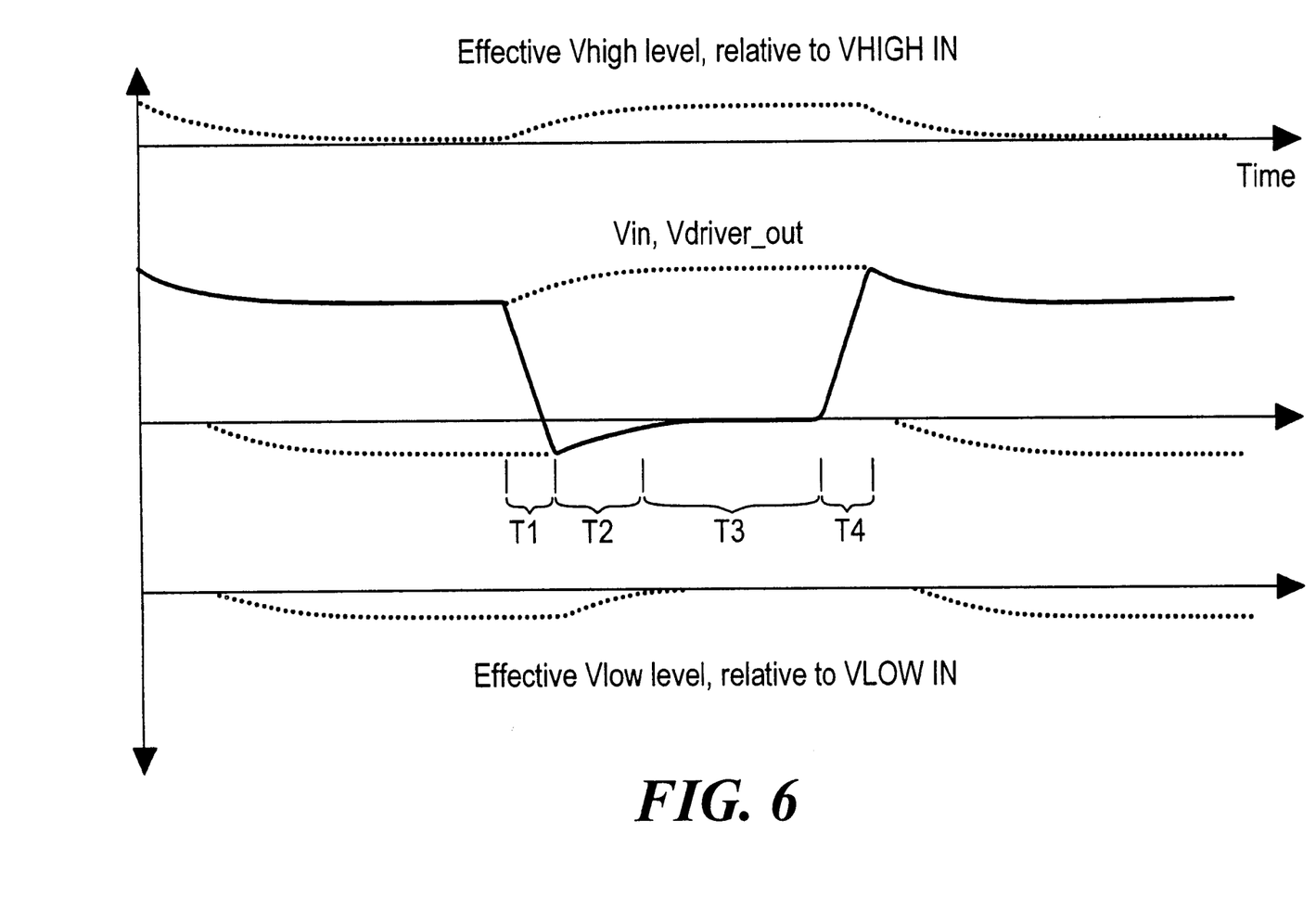
FIG. 6 shows a timing diagram detailing the timing of the conditioning circuits shown in FIGS. 5A and 5B.

The switching of the switching elements 50A and 50B in both circuits illustratively is controlled so that its respective capacitor C1 or C2 is begins charging as the driver output voltage begins to transition to the opposite voltage level. FIG. 6 graphically illustrates this for both conditioning circuits 38 and 40. For example, with regard to the high voltage conditioning circuit 38, the capacitor C1 begins charging just as the driver output signal begins its transition from high to low. The capacitor C1 charges to the VspikeH voltage for a relatively long time, which includes the following times:

Time T1, which is the time that the driver output voltage transitions to the Vlow−VspikeL voltage;

Time T2, which is the time that the driver output voltage increases (i.e., decays) from the Vlow−VspikeL voltage, to the Vlow voltage;

Time T3, which is the time that the driver output voltage remains at the Vlow voltage; and Time T4, which is the time that the driver output voltage transitions from the Vlow voltage to the Vhigh+VspikeH voltage.

After time T4, the voltage at the output of the high voltage conditioning circuit 38 decays at a rate specified by the known time constant Tau, which equals the product of the resistance of resistor R1 and the capacitance of capacitor C1. As also can be determined by inspection of FIG. 6, the timing of the low voltage conditioning circuit 40 illustratively operates in a manner similar to, but 180 degrees out of phase with, that of the high voltage conditioning circuit 38.

In some embodiments, the timing of the switching element in either conditioning circuit 38 or 40 is a function of the time for the amplitude of the driver output signal to reach its maximum/minimum voltage. For example, the switching element 50A and/or 50B in each conditioning circuit can be set to begin its decay phase only after the driver output voltage has reached the set maximum/minimum voltage (i.e., Vhigh+VspikeH, or Vlow−VspikeL, whichever is the case). In other embodiments, the switching element 50A and/or 50B in each conditioning circuit 38 and/or 40 is independent of the timing of the driver output signal.

Figure 7:
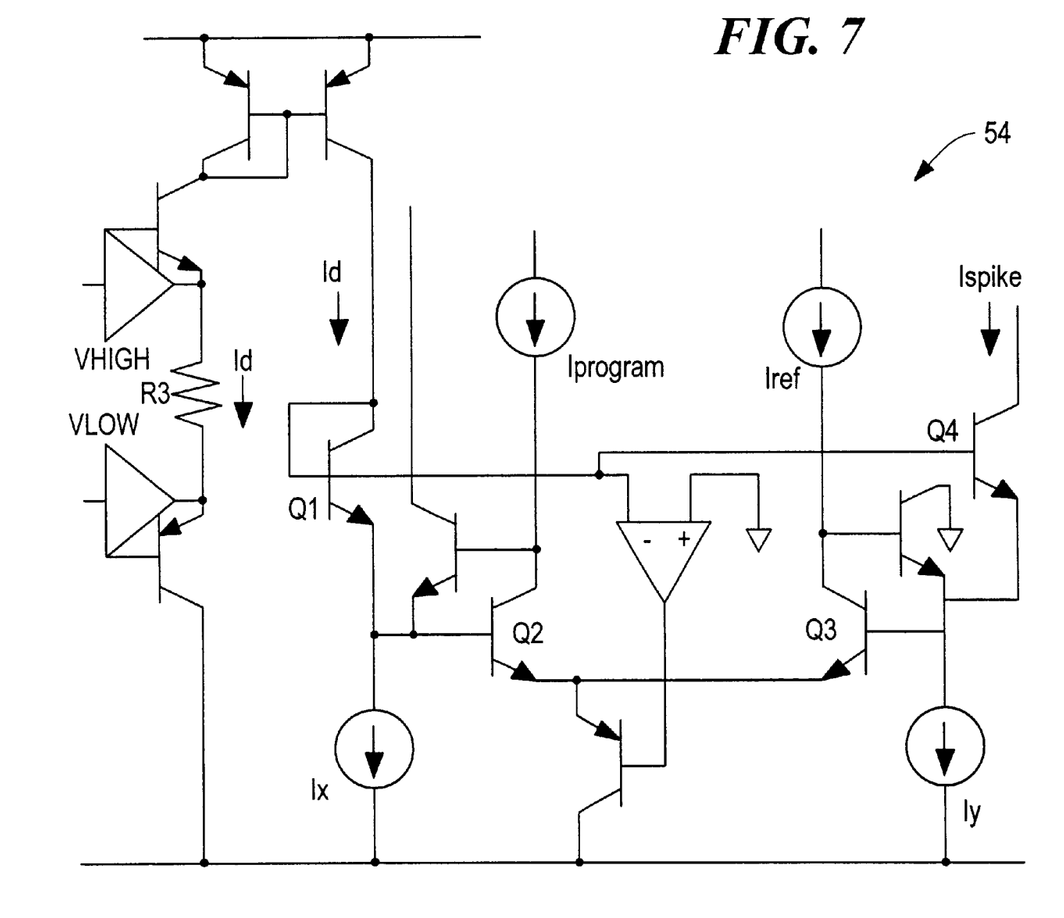
FIG. 7 schematically shows a programmable control circuit that may be used to control the conditioning circuits shown in FIGS. 5A and 5B.

As noted above, the IspikeH and IspikeL currents respectively control the VspikeH and VspikeL voltages. Accordingly, such current can be selected to control the overshoot produced by the conditioning circuits 38 and 40. Any conventional circuit may be used to control such current. FIG. 7 shows an exemplary current control circuit 54 that may be used to control the Ispike current. In particular, the current control circuit 54 includes, among other things, four identical NPN transistors Q1, Q2, Q3, and Q4 that form a translinear loop, a resistor R3, and two current sources Iprogram and Iref. The Iprogram source produces a current Iprogram, and the Iref current source produces a current Iref. In illustrative embodiments, the Ispike current is calculated in accordance with the following equation:

$$Ispike=((Vhigh-Vlow)/R3)*(Iprog/Iref)$$

The Iref current source illustratively is set to a prespecified current value, while the Iprogram current source illustratively is controllable to produce the desired current.

In other embodiments, the conditioning circuits 38 and 40 may be used as small signal device drivers. To that end, the capacitors C1 and C3 are removed from their respective voltage elements 48A and 48B, thus increasing the response time of the conditioning circuits 38 and 40. Such application illustratively is for small signals having voltages of one volt or less. When used in this manner, a small change to one of the input DC limit voltages (e.g., the Vhigh and Vlow inputs 26 and 28 on the driver 20) produces a corresponding small but rapid change to the output voltage across the driver output 23.

Those skilled in the art should understand that the circuit elements in many embodiments are exemplary. For example, the voltage elements 48A and 48B can use other components instead of, or in addition to, the shown resistors and capacitors. For example, an inductor may be used.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

We claim:

1. An apparatus for conditioning an output waveform delivered from a testing device, the apparatus comprising:

an input for receiving an input voltage;

an output coupled with the testing device, the output being capable of delivering an output voltage;

a voltage element coupled between the input and the output; and a switching element to alternatively charge and discharge the voltage element, the voltage element being controlled by the switching element to have a control voltage between a first voltage and a second voltage, the output voltage being the sum of the control voltage and the input voltage during both switching states.

2. The apparatus as defined by claim 1 wherein the output waveform is clamped by the sum of the control voltage and the input voltage.

3. The apparatus as defined by claim 1 wherein the voltage element includes at least one of a resistance, and inductance, and a capacitance.

4. The apparatus as defined by claim 3 wherein the control voltage has an associated decay rate that is a function of the resistance and capacitance of the voltage element.

5. The apparatus as defined by claim 1 wherein the voltage element includes a resistor in parallel with a capacitor.

6. The apparatus as defined by claim 1 wherein the control voltage is produced by a current transmitting through a resistance, the current being controllable to control the amplitude of the control voltage.

7. The apparatus as defined by claim 1 wherein the switching element comprises a first switch along a first current path, and a second switch along a second current path, the first current path being in parallel with the second current path.

8. The apparatus as defined by claim 1 wherein the control voltage is a positive voltage.

9. The apparatus as defined by claim 1 wherein the control voltage is a negative voltage.

10. A circuit for controlling the output voltage produced by a Class-AB driver, the circuit comprising:

an input for receiving an input DC voltage;

an output coupled with the Class-AB driver and having an output voltage;

a voltage element coupled between the input and the output; and a switching element to alternatively charge and discharge the voltage element, the voltage element being controlled by the switching element to have a control voltage of between a first voltage and a second voltage, the output voltage being the sum of the control voltage and the input voltage.

11. The circuit as defined by claim 10 wherein the output waveform is clamped by the output voltage of the circuit.

12. The circuit as defined by claim 10 wherein the voltage element includes a resistance and a capacitance, the control voltage having an associated decay rate that is a function of the resistance and capacitance of the voltage element.

13. The circuit as defined by claim 10 wherein the control voltage is produced by a current transmitting through a resistance, the current being controllable to control the amplitude of the control voltage.

14. The circuit as defined by claim 10 wherein the switching element comprises a first switch along a first current path, and a second switch along a second current path, the first current path being in parallel with the second current path.

15. The apparatus as defined by claim 10 wherein the control voltage is one of a positive voltage and a negative voltage.

16. An apparatus for conditioning an output waveform delivered from a testing device, the apparatus comprising:

means for receiving an input voltage;

means for delivering an output voltage to the testing device;

means for generating a voltage between the receiving means and the delivering means; and means for alternatively charging and discharging the generating means, the generating means being controlled by the charging and discharging means to have a control voltage of between a first voltage and a second voltage, the output voltage being the sum of the control voltage and the input voltage during both switching states.

17. The apparatus as defined by claim 16 the means for alternatively charging and discharging the generating means includes a pair of parallel switches.

18. The apparatus as defined by claim 16 wherein the generating means includes a capacitance and a resistance, the control voltage having an associated decay rate that is a function of the resistance and capacitance.

19. The apparatus as defined by claim 16 wherein the control voltage is produced by a current transmitting through a resistance, the current being controllable to control the amplitude of the control voltage.

20. The apparatus as defined by claim 16 wherein the testing device includes a Class-AB driver having an input node, the delivering means being coupled with the input node.

\* \* \* \* \*